(12) United States Patent
Kawai

(10) Patent No.: US 6,522,491 B1
(45) Date of Patent: Feb. 18, 2003

(54) MAGNETORESISTIVE ELEMENT INPUT CIRCUIT

(75) Inventor: Takumi Kawai, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 398 days.

(21) Appl. No.: 09/625,311

(22) Filed: Jul. 25, 2000

(30) Foreign Application Priority Data

Jan. 30, 2000 (JP) ....................................... 2000-004772

(51) Int. Cl.[7] .................................................. G11B 5/03
(52) U.S. Cl. .............................. 360/66; 360/67; 360/46; 360/61
(58) Field of Search .............................. 360/67, 66, 46, 360/61, 62, 63; 327/530

(56) References Cited

U.S. PATENT DOCUMENTS 5,444,579 A * 8/1995 Klein et al. ................... 360/67
5,623,378 A * 4/1997 Shibasaki et al. ............. 360/67

FOREIGN PATENT DOCUMENTS

JP 8-255302 10/1996
JP 8-315304 11/1996

* cited by examiner

Primary Examiner—Alan T. Faber
(74) Attorney, Agent, or Firm—Arent Fox Kintner Plotkin & Kahn, PLLC

(57) ABSTRACT

A magnetoresistive element input circuit includes a first resistor connected between a magnetoresistive (MR) element and a first power source. A first current source is connected between the MR element and a second power source and supplies a DC bias current to the MR element in an active mode. A second resistor is connected between the MR element and the first current source. A capacitor is connected to a node between the second resistor and the first current source and to the first power supply. A differential amplifier is connected to the MR element. A voltage supply circuit is connected to the node and supplies the node with a voltage, when the input circuit is in an inactive mode, which is substantially equal to the voltage supplied to the node when the input circuit is in the active mode.

13 Claims, 7 Drawing Sheets

MAGNETORESISTIVE ELEMENT INPUT CIRCUIT

BACKGROUND OF THE INVENTION

The present invention relates to a magnetoresistive element input circuit, and more particularly, to an input circuit or preamplifier of an integrated circuit for driving a magnetoresistive head.

A magnetic head formed by a magnetoresistive (MR) element is used in magnetic recording devices, such as magnetic tape devices and hard disk devices, to increase the recording density. An input circuit supplies the magnetoresistive element with a bias current to read data signals from a recording medium and amplify the signals.

FIG. 1 is a schematic circuit diagram showing a first example of a prior art MR element input circuit 10.

The input circuit 10 includes a first resistor 12 connected between an MR element 11 and a high potential power supply (first power supply) V1, a second resistor 13 and a current source 14 connected in series between the MR element 11 and a low potential power supply (second power supply) V2, and a differential amplifier 15 having two input terminals connected to the two terminals of the MR element 11. The first and second resistors 12, 13 have the same resistance. A capacitor 16 is connected to a node N1 between the second resistor 13 and the current source 14. The capacitor 16 substantially equalizes the alternating current impedance at the two terminals of the MR element 11.

In the first example, since the input impedances at the two terminals of the MR element 11 are the same, the two signals respectively provided to the differential amplifier 15 include external noise of the same phase. Accordingly, the S/N ratio of the signal output by the differential amplifier 15 is improved and the affect of the external noises is reduced.

However, in the first prior art example, the current source 14 constantly supplies the MR element 11 with a bias current. Thus, the power is consumed even when the input circuit 10 is inactive.

Accordingly, an MR element input circuit 20 (second prior art example) shown in FIG. 2 has been proposed to reduce power consumption. Like or same reference numerals are given to those components that are the same as the corresponding components of the first prior art example.

The second example further includes a third resistor 21, a switch element 22, and an NPN transistor 23. The transistor 23 is connected between a first resistor 12a and a high potential power supply V1. The base of the transistor 23 is connected to the high potential power supply V1 via the third resistor 21 and to the low potential power supply V2 via the switch element 22. The sum of the resistance of the first resistor 12a and the ON resistance of the transistor 23 is the same as the resistance of the second resistor 13.

In the input circuit 20, the current Im flowing through the MR element 11 is inhibited when a control signal (not shown) closes the switch element 22 and deactivates the current source 14. This reduces power consumption when the input circuit 20 is inactive.

However, in the second prior art example, when the input circuit 20 switches from an active state to an inactive state (i.e., when the switch element 22 goes on and the current source 14 is deactivated), the charge stored in the capacitor 16 may cause an excessively large amount of current to flow through the MR element 11.

Further, when the input circuit 20 is active, the charge stored in the capacitor 16 is spontaneously discharged, for example, through the second resistor 13, the MR element 11, and the differential amplifier 15. Therefore, when the input circuit 20 shifts from an inactive state to an active state (i.e., when the switch element 22 goes off thereby activating the current source 14 and recharging the capacitor 16), a current exceeding a tolerable level may flow through the MR element 11, as shown in FIG. 3.

Additionally, in the second prior art example, a stable signal cannot be obtained from the input circuit 20 unless the capacitor 16 is charged. The recharging time of the capacitor 16 (in FIG. 3, the time required to stabilize voltage VN1 (the voltage at node N1)) thus determines the time for the input circuit 20 to switch from an active state to an inactive state, or the transition period. Since the required capacitance of the capacitor 16 is relatively large (e.g., 1 μF) to stabilize operation, the transition period is long.

To solve these problems, an MR element input circuit 30 (third prior art example) shown in FIG. 4 has been proposed. Switch elements 31, 32 are respectively connected to the two terminals of the MR element 11 to disconnect the flow of current Im through the MR element 11. However, the number of elements connected between the MR element 11 and the high potential power supply V1 and between the MR element 11 and the capacitor 16 is increased in the third embodiment. This makes it difficult to match the alternating current impedance at the two terminals of the MR element 11. The differential amplifier 15 may thus be affected by external noises. Further, since the impedance at both terminals of the MR element is high when the input circuit 20 is inactive, an undesirable current may flow through the MR element 11.

SUMMARY OF THE INVENTION

It is an object of the present invention to provide an input circuit that is not overly affected by external noises, consumes less power when in an inactive state, and has a short transition period for shifting from an inactive state to an active state.

To achieve the above object, the present invention provides a magnetoresistive element input circuit having an active mode and an inactive mode. The input circuit includes a first resistor connected between a magnetoresistive element and a first power source. A first current source is connected between the magnetoresistive element and a second power source to supply a DC bias current to the magnetoresistive element in the active mode. A second resistor is connected between the magnetoresistive element and the first current source. A capacitor is connected to a node between the second resistor and the first current source and to the first power supply. A differential amplifier is connected to the magnetoresistive element. A voltage supply circuit is connected to the node to supply the node, when the input circuit is in the inactive mode, with a voltage substantially equal to that supplied to the node when the input circuit is in the active mode.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
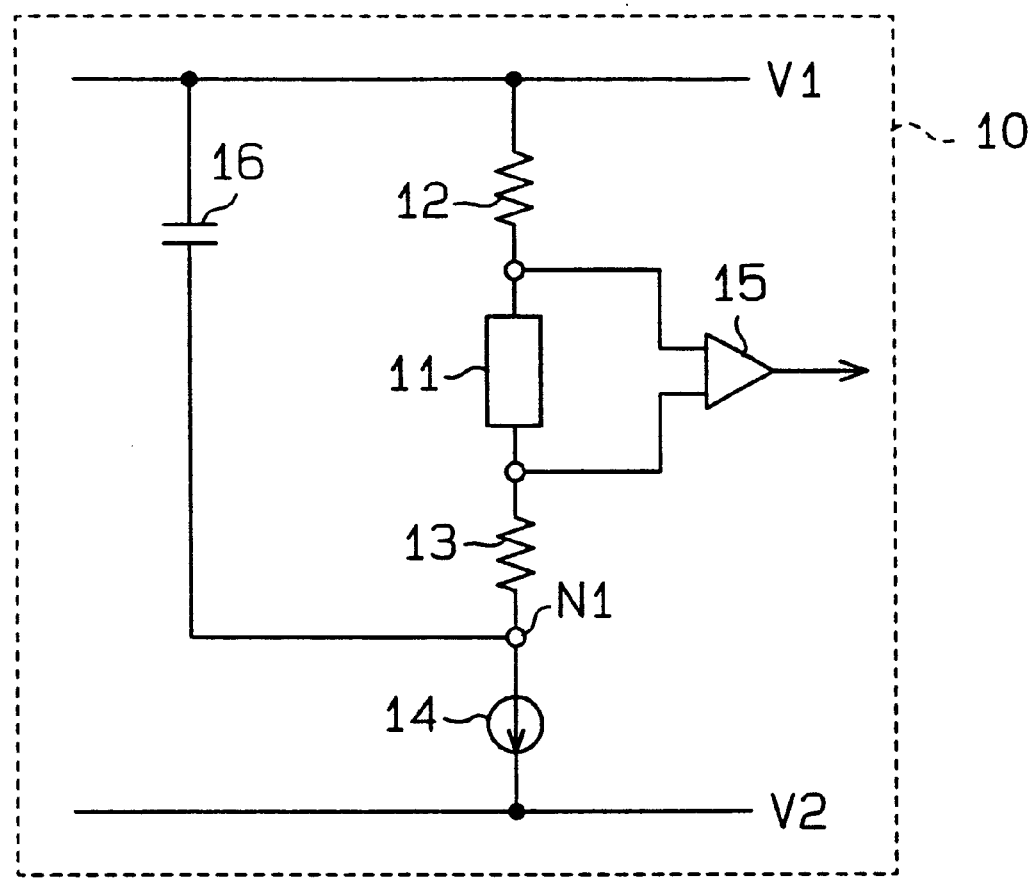
FIG. 1 is a schematic circuit diagram showing a first example of a prior art input circuit.
Figure 2:
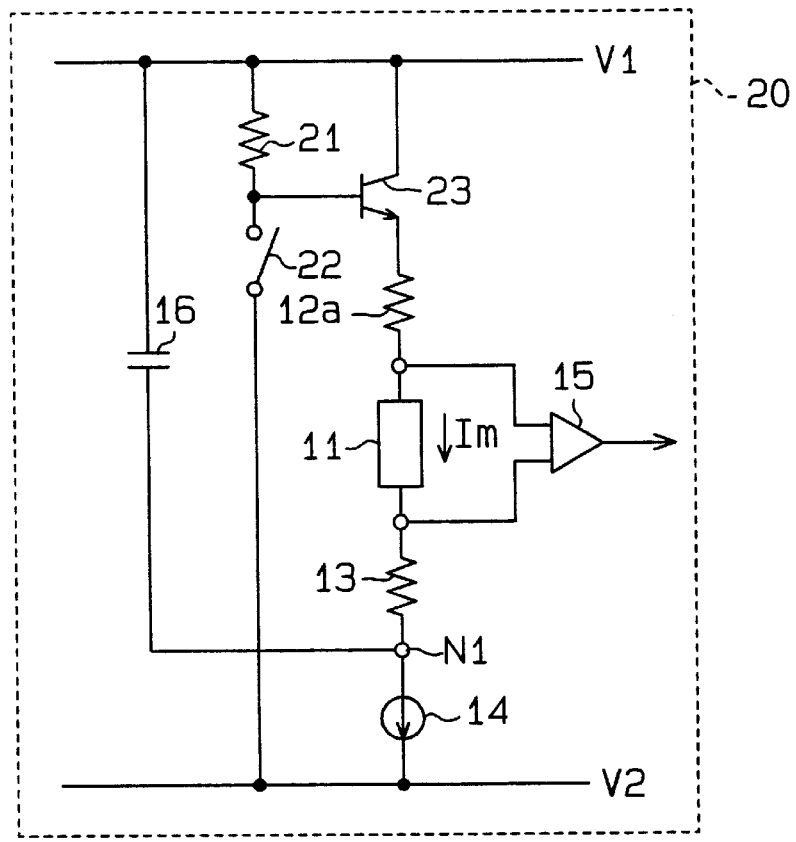
FIG. 2 is a schematic circuit diagram showing a second example of a prior art input circuit.
Figure 3:
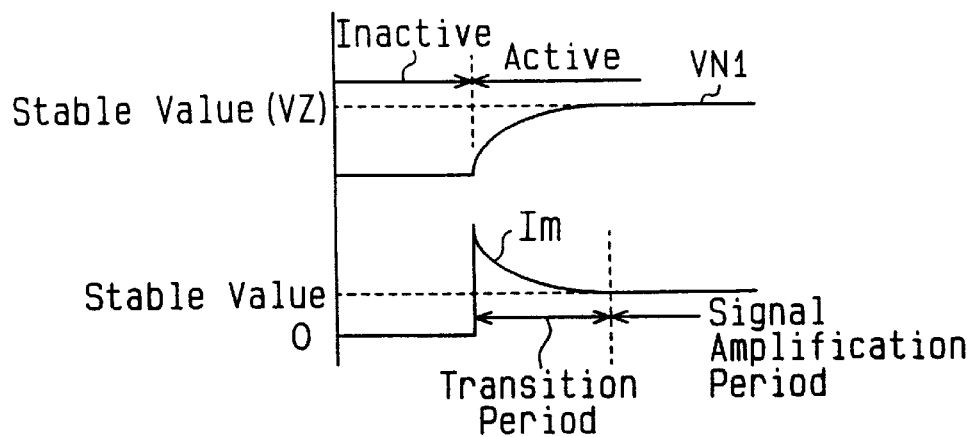
FIG. 3 is a graph illustrating the operation of the input circuit of FIG. 2.
Figure 4:
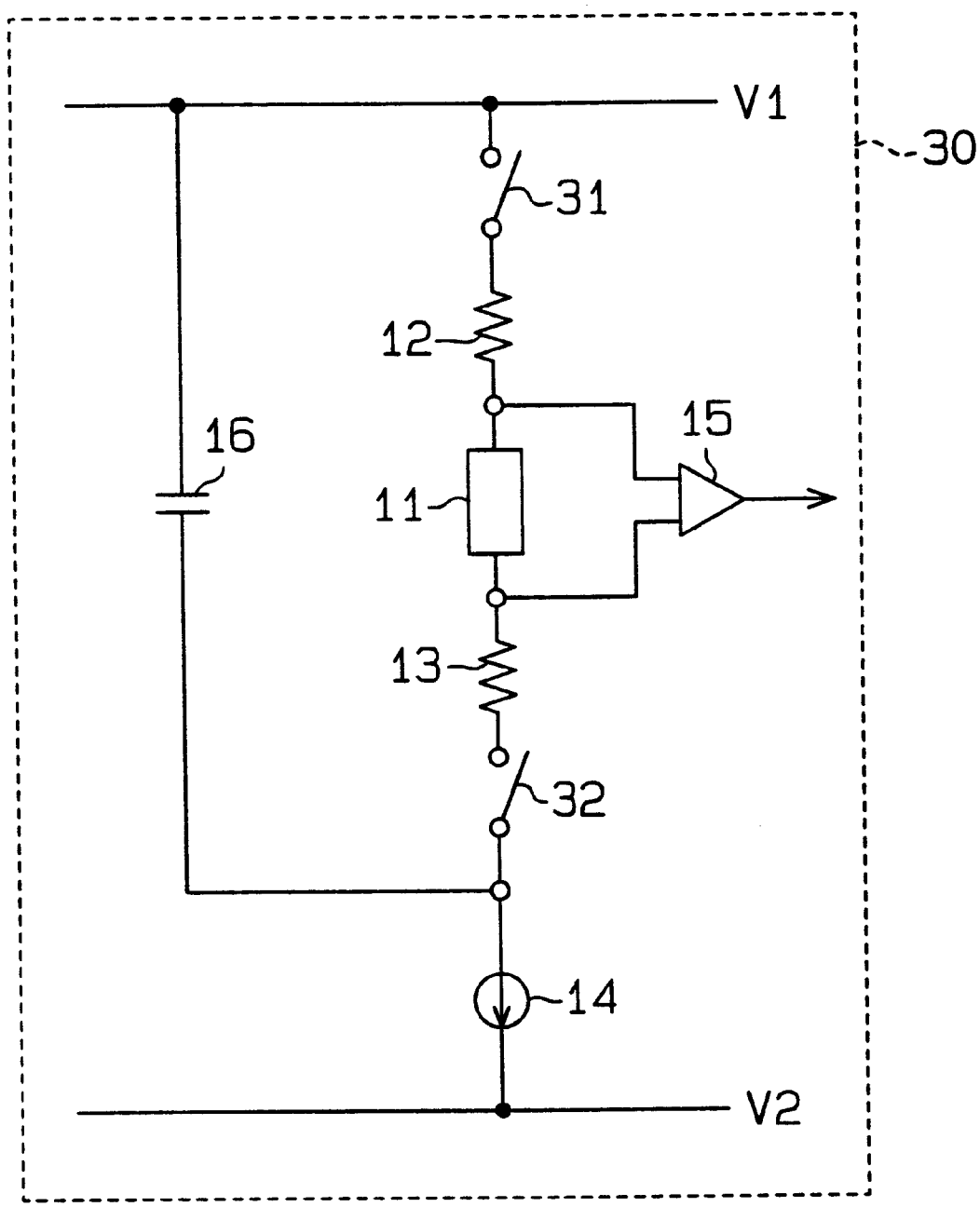
FIG. 4 is a schematic circuit diagram showing a third example of a prior art input circuit.

In the drawings, like numerals are used for like elements throughout.

First Embodiment

Figure 5:
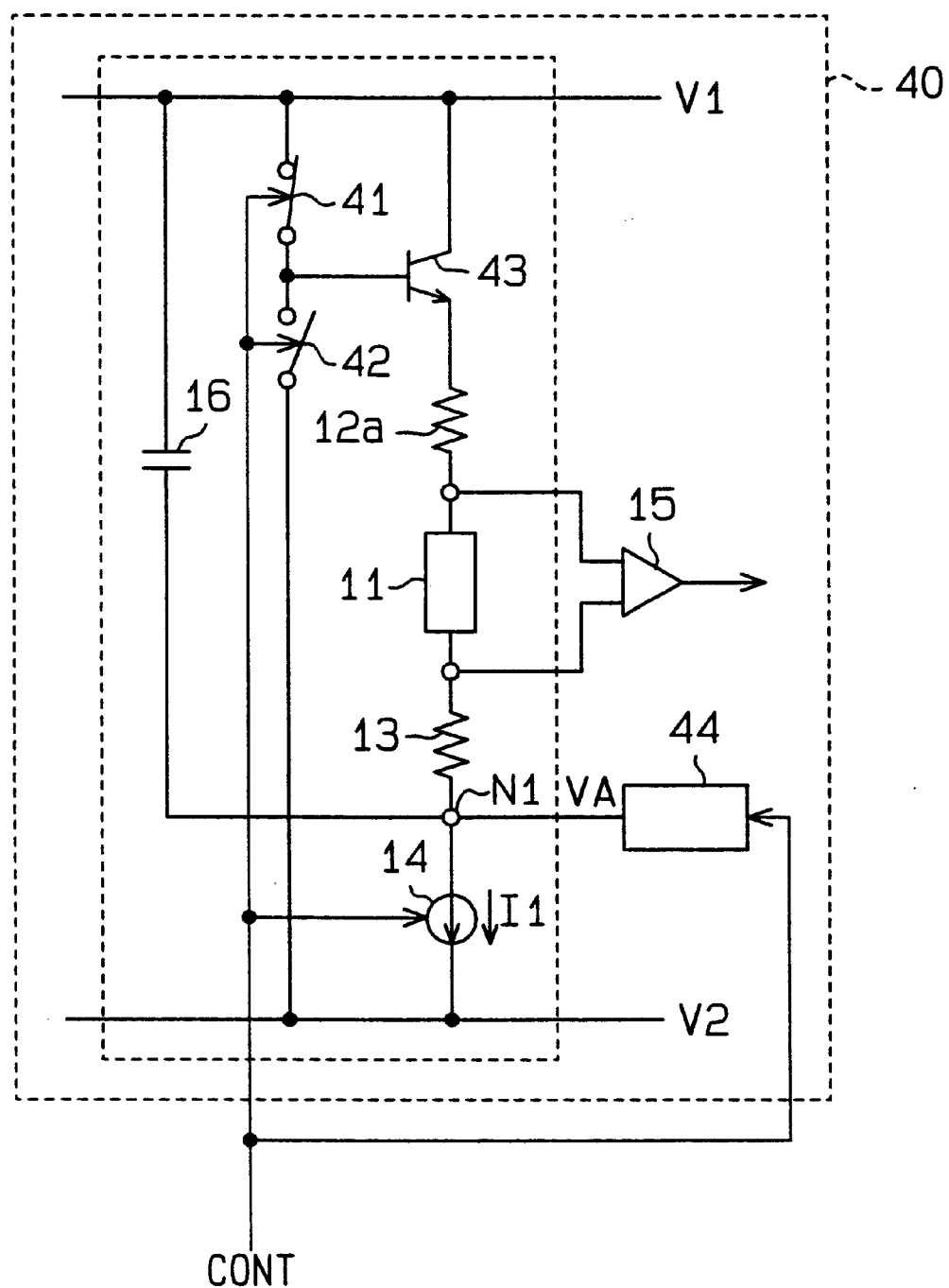
FIG. 5 is a schematic circuit diagram showing an input circuit according to a first embodiment of the present invention.

FIG. 5 is a schematic circuit diagram showing an input circuit 40 according to a first embodiment of the present invention. The input circuit 40 is selectively shifted between an active state (mode) and an inactive state (mode) in response to a control signal CONT provided from an external device.

The input circuit 40 includes switch elements 41, 42, an NPN transistor 43, and a voltage supply circuit 44. The switch elements 41, 42 and the NPN transistor 43 form a switch circuit (second switch).

Due to reasons such as size and capacitance, a capacitor 16 does not have to be integrated with the input circuit 40. In other words, all elements except for the MR element 11 and the capacitor 16 are formed in the same semiconductor integrated circuit.

The switch elements 41, 42 are connected in series between a high potential power supply V1 and a low potential power supply V2. The base of the transistor 43 is connected to a node between the switch elements 41, 42. The collector of the transistor 43 is connected to the high potential power supply V1, and the emitter is connected to a first resistor 12a.

The switch elements 41, 42, each of which is, for example, a MOS transistor, go on and off in a complementary manner in response to the control signal CONT. That is, the switch element 41 goes on and the switch element 42 goes off when the control signal CONT has a predetermined first logical level (e.g., a high level of the high potential power supply V1). When the control signal CONT has a predetermined second logical level (e.g., a low level of the low potential power supply V2), the switch element 41 goes off and the switch element 42 goes on.

When the switch element 41 is on, the base of the transistor 43 is connected to the high potential power supply V1 thereby activating the transistor 43. When the switch element 42 is on, the base of the transistor 43 is connected to the low potential power supply thereby deactivating the transistor 43.

A current source (first current source) 14 is activated when the control signal CONT goes high and deactivated when the control signal CONT goes low. Accordingly, when the control signal CONT is high and the transistor 43 and the current source 14 are activated, a bias current flows through the MR element 11 and the input circuit 40 becomes active. When the control signal CONT is low and the transistor 43 and the current source 14 are deactivated, the flow of bias current through the MR element 11 is inhibited thereby causing the input circuit 40 to be inactive.

The voltage supply circuit 44 is connected to a node N1 between the second resistor 13 and the current source 14. In response to the control signal CONT, the voltage supply circuit 44 supplies a predetermined voltage VA to the node N1 when the input circuit 40 is inactive.

When the input circuit 40 is active, the node N1 is supplied with voltage VZ. The predetermined voltage VA is equal to or close to the voltage VZ.

In other words, the voltage VZ at the node N1 when the input circuit 40 is active is expressed by the equation of:

$$VZ=V1-VBE-(R1+MR+R2)\times I1.$$

In the equation, R1, R2 respectively represent the resistance of the resistors 12a and 13, MR represents the resistance of the MR element 11, I1 represents the current supplied by the current source 14, C represents the capacitance of the capacitor 16, and VBE represents the voltage between the base and emitter of the transistor 43.

The voltage supply circuit 44 substantially equalizes the active state voltage VZ with the inactive state voltage VA at the node N1. Since the potential difference between the two terminals of the capacitor 16 is the same when the input circuit 40 is active and inactive, the capacitor 16 is not discharged. Accordingly, the transition period for shifting the input circuit 40 from an inactive state to an active state is shortened.

The voltage VA does not have to be equal to the voltage VZ as long as it is approximate to the voltage VZ. This decreases the time for charging and discharging the capacitor 16 and effectively shortens the transition period.

It is preferred that the value of the current consumed by the voltage supply circuit 44 be smaller than that of the direct bias current supplied to the MR element 11 from the current source 14. This decreases the consumed current during the inactive state.

Figure 6:
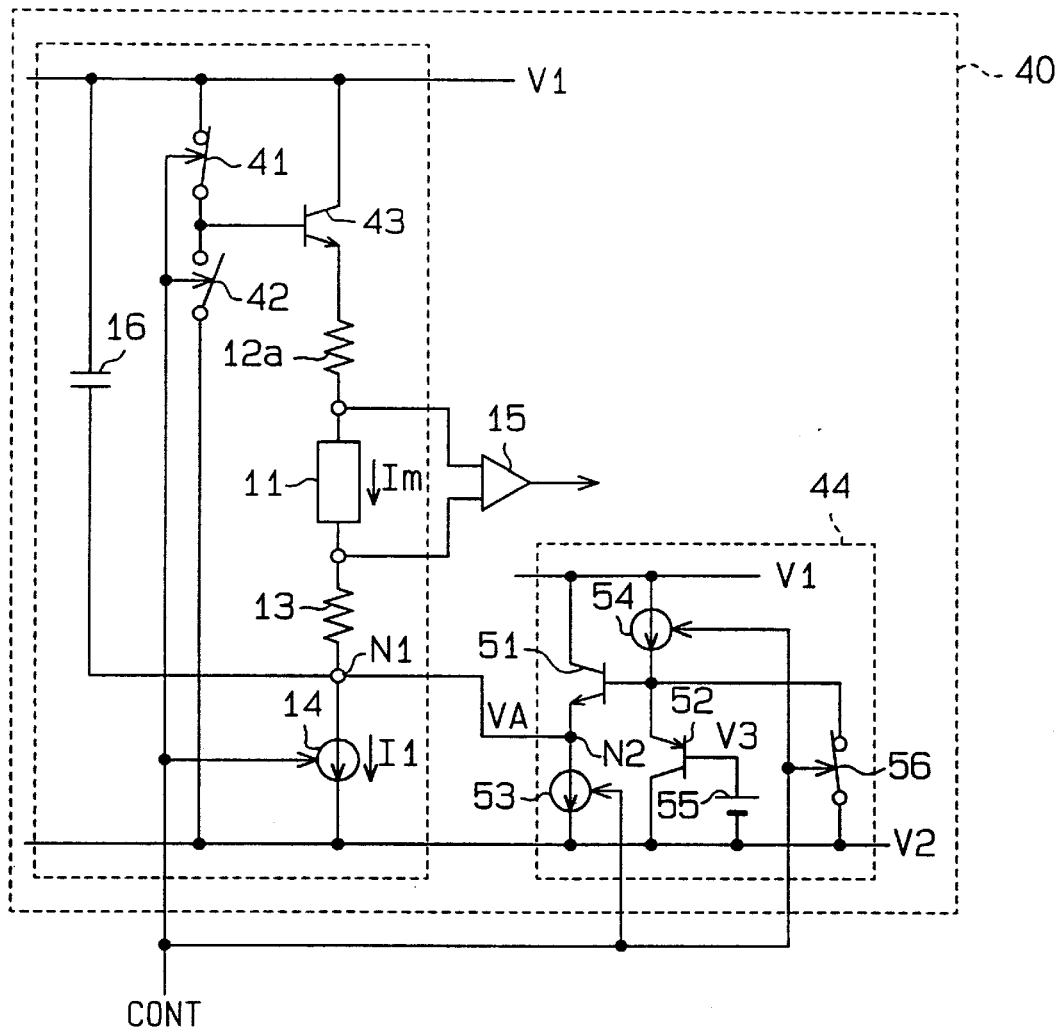
FIG. 6 is a schematic circuit diagram showing a voltage supply circuit of the input circuit of FIG. 5.

FIG. 6 is a schematic circuit diagram of the input circuit 40 showing the voltage supply circuit 44 in more detail.

The voltage supply circuit 44 includes first and second transistors 51, 52, second and third current sources 53, 54, a voltage source 55, and a switch element (first switch) 56.

It is preferred that an NPN transistor be used as the first transistor 51. In the first transistor 51, the collector is connected to the high potential power supply V1, the emitter is connected to the second bias current source 53, and the base is connected to the emitter of the second transistor 52. A node N2 between the first transistor 51 and the second current source 53 is connected to the node N1. It is preferred that a PNP transistor be used as the second transistor 52. In the second transistor 52, the emitter is connected to the third current source 54, the collector is connected to the low potential power supply V2, and the base is connected to the voltage source 55.

The switch element 56 is connected between the emitter of the second transistor 52 (the base of the first transistor 51) and the low potential power supply V2. The switch element 56 is preferably a MOS transistor that goes on and off in response to the control signal CONT. The second and third current sources 53, 54 are also activated and deactivated in response to the control signal CONT.

More specifically, when the input circuit 40 is active and in response to the control signal CONT (e.g., high level), the switch element 56 goes on, the current sources 53, 54 are deactivated, and the first transistor 51 is deactivated. In this state, voltage is not supplied at node N1 by the voltage supply circuit 44.

When the input circuit 40 is inactive and in response to the control signal CONT (e.g., low level), the switch element 56 goes off and the current sources 53, 54 are activated. This activates the first and second transistors 51, 52 with the bias current of the second and third current sources 53, 54, respectively. In this state, the voltage VA at node N2 is supplied to node N1.

The voltage VA at node N2 is determined by the first and second transistors 51, 52 and the voltage source 55. Therefore, the voltage VA is expressed by the equation:

$$VA = V3 + VBE2 - VBE1.$$

In the equation, V3 represents the voltage of the voltage source 55, and VBE1 and VBE2 represent the voltages between the base and emitter of the first and second transistors 51, 52, respectively.

The voltage VBE1 of the first transistor 51 and the voltage VBE2 of the second transistor 52 are substantially equal. Accordingly, by setting the voltage V3 of the voltage source 55 to a value that is substantially equal to or approximate to the active state voltage VZ, the voltage at node N1 becomes equal to or approximate to the inactive state voltage. This prevents the potential difference between the terminals of the capacitor 16 from changing between active and inactive states. Thus, the capacitor 16 does not require much time for charging and discharging.

Figure 7:
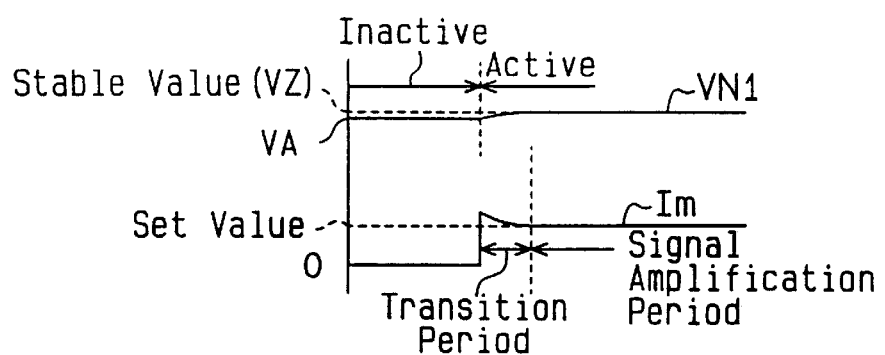
FIG. 7 is a graph illustrating the operation of the input circuit of FIG. 5.

The voltage supply circuit 44 substantially equalizes the active state voltage VZ with the inactive state voltage VA at the node N1 in the input circuit 40. Therefore, the potential difference between the two terminals of the capacitor 16 does not change regardless of whether the input circuit 40 is active or inactive, and time is not required to the charge and discharge of the capacitor 16. This shortens the transition period required for the input circuit 40 to shift from the inactive state to the active state, as shown in FIG. 7.

The voltage VA does not have to be exactly the same as the active state voltage VZ as long as it is an approximate value. In such case, the time required to charge and discharge the capacitor 16 is still short. This effectively shortens the transition period.

The current consumed by the voltage supply circuit 44 is substantially the same as the sum of the bias currents of the current sources 53, 54. The bias currents are only required to have the minimal values that are necessary for stably operating the transistors 51, 52. Thus, the current consumption of the voltage supply circuit 44 is significantly less than the current of the MR element current source 14, which is 6 mA to 14 mA. This reduces the power consumption of the input circuit 40 in the inactive state. The present applicants have confirmed that the sum of the current values of the current sources 53, 54 is about one fifth to one tenth of the bias current (6 mA to 14 mA) of the current source 14.

The advantages of the input circuit 40 of the first embodiment will now be described.

(1) The voltage supply circuit 44 supplies voltage VA, which is substantially equal to the voltage VZ when the input circuit 40 is in an active state, to node N1. This shortens the transition period required for the input circuit 40 to shift from an inactive state to an active state.

(2) The second and third current sources 53, 54 of the voltage supply circuit 44 provide the associated first and second transistors 51, 52 with bias currents that are significantly less than the DC bias current supplied to the MR element 11. This reduces current consumption when the input circuit 40 is in an inactive state.

Second Embodiment

Figure 8:
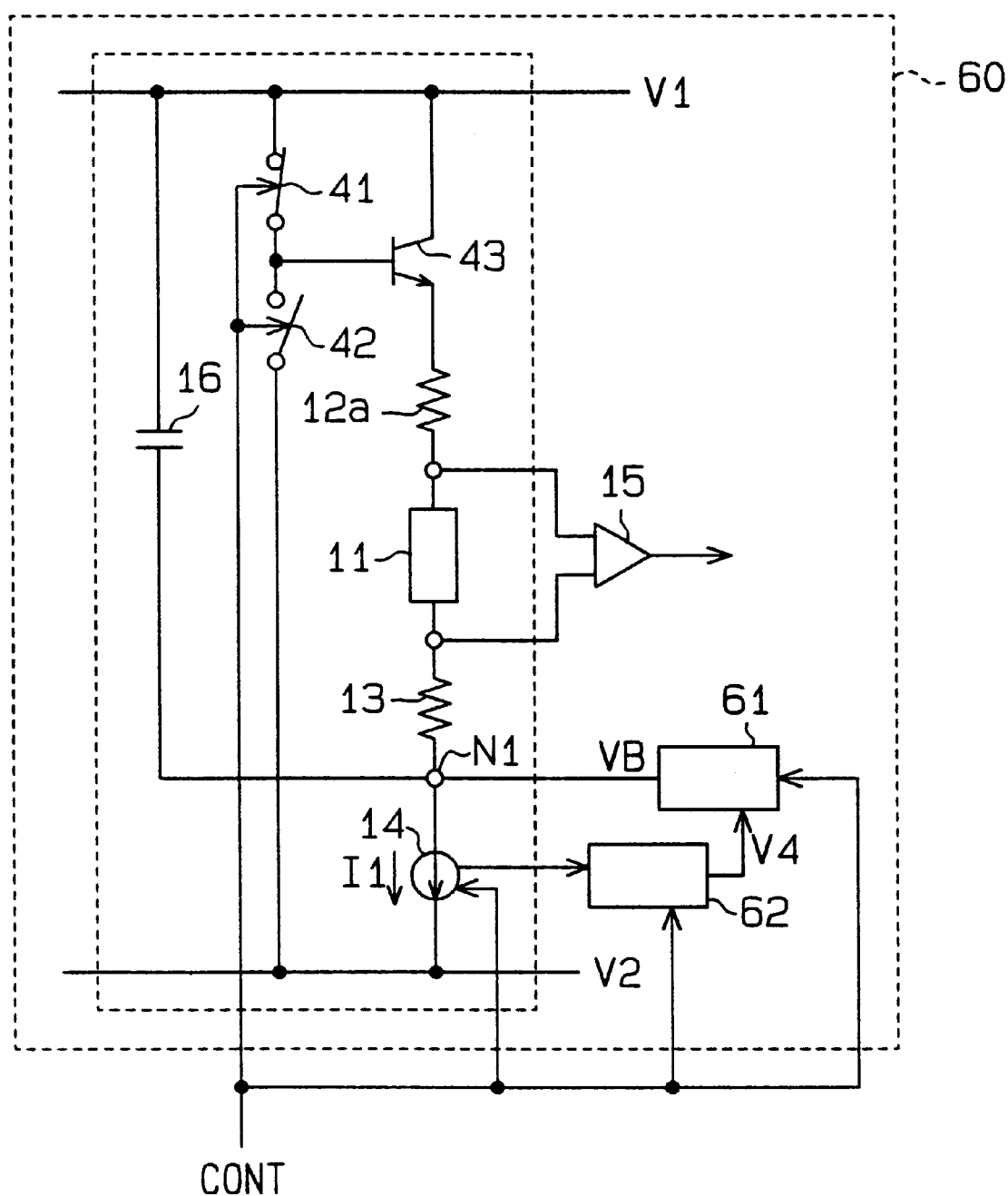
FIG. 8 is a circuit diagram showing an input circuit according to a second embodiment of the present invention.

FIG. 8 is a schematic circuit diagram showing an input circuit 60 according to a second embodiment of the present invention. The input circuit 60 has a voltage supply circuit 61 and a current-voltage transform circuit 62 in lieu of the voltage supply circuit 44 of the first embodiment.

In response to the control signal CONT and when the input circuit 60 is in an active state, the current/voltage transform circuit 62 transforms a current I1 of the current source 14 to a voltage V4. The voltage V4 is supplied to the voltage supply circuit 61 when the input circuit 60 is in an inactive state.

In response to the control signal CONT and when the input circuit 60 is in an inactive state, the voltage supply circuit 61 supplies node N1 with a voltage VB, which is based on the voltage V4, and inhibits the supply of the voltage VB when the input circuit 60 is active.

When the input circuit 60 is inactive, the voltage supply circuit 61 supplies node N1 with the voltage VB in accordance with the current I1. Thus, the voltage at N1 when the input circuit 60 is inactive is substantially equal to or approximate to the active state voltage even when the current I1 of the current source 14 changes.

Accordingly, the voltage at the node N1 when the input circuit 60 is active is substantially equal to the voltage VB supplied to the node N1 by the voltage supply circuit 61 when the input circuit 60 is inactive. The potential difference between the two terminals of the capacitor 16 thus does not change regardless of whether the input circuit 60 is active or inactive, and charge is not discharged from the capacitor 16. As a result, time for charge and discharge of the capacitor 16 is not required, and the transition period required for the input circuit 60 to shift from an inactive state to an active state is shortened.

It is required only that the voltage VB be a value approximate to the voltage at the node N1 when the input circuit 60 is active. In such case, the charge and discharge time of the capacitor 16 is still short. Thus, the transition period is effectively shortened.

Figure 9:
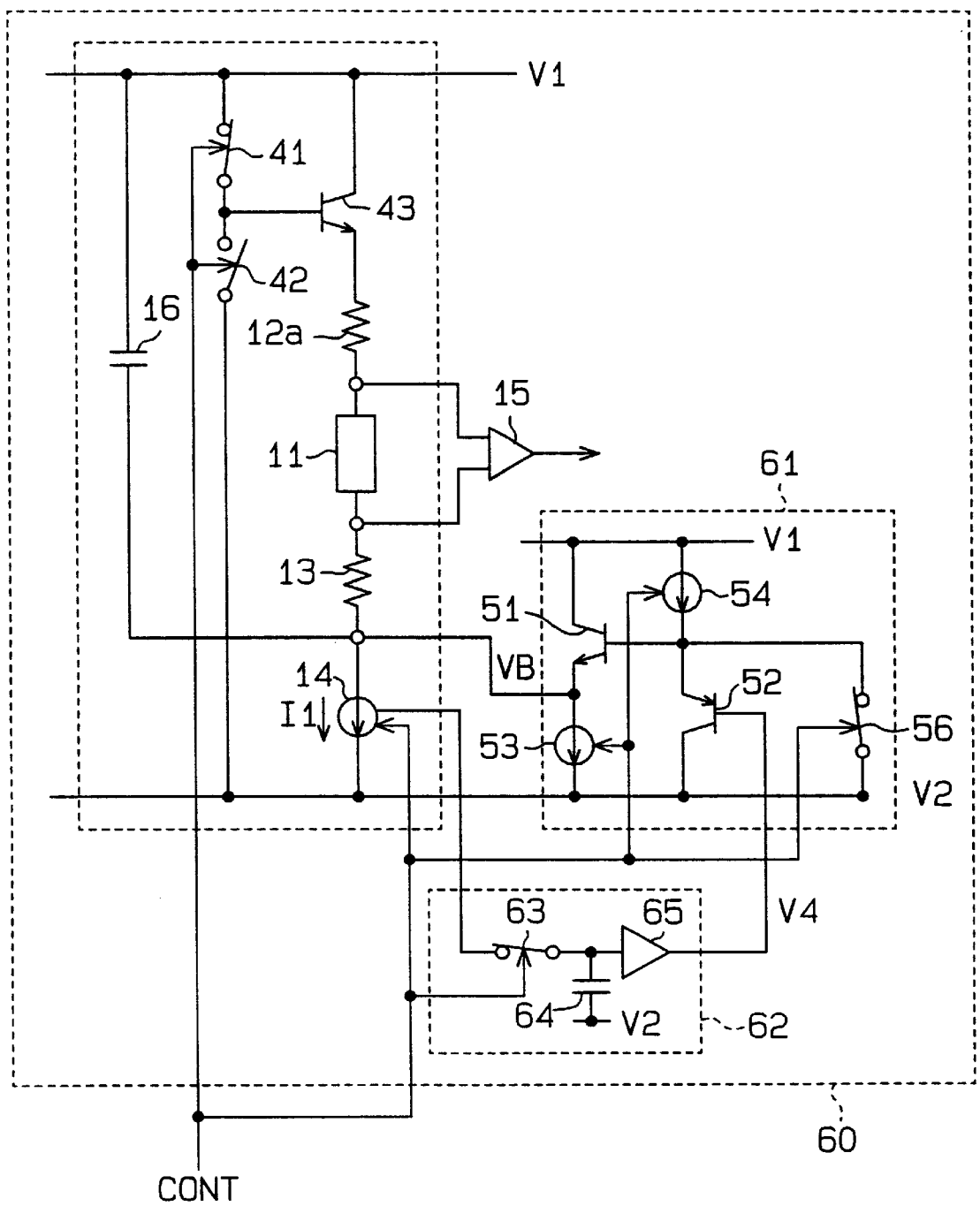
FIG. 9 is a schematic circuit diagram showing a voltage supply circuit and a current-voltage transform circuit of the input circuit of FIG. 8.

FIG. 9 is a schematic circuit diagram of the input circuit 60 showing the voltage supply circuit 61 and the current-voltage transform circuit 62 in more detail.

Except for the voltage source 55, the configuration of the voltage supply circuit 61 is the same as the voltage supply circuit 44 of the first embodiment. The current-voltage transform circuit 62 applies voltage V4 to the base of the second transistor 52 in the voltage supply circuit 61.

The current-voltage transform circuit 62 includes a switch element (third switch) 63, a capacitor 64, and a current-voltage transform amplifier 65.

The switch element 63, which is preferably a MOS transistor, goes on and off in response to the control signal CONT. The capacitor 64 is connected to a node between the switch element 63 and the amplifier 65 and to the low potential power supply V2.

In the current-voltage transform circuit 62, a charge corresponding to the current I1 of the current source 14 is stored in the capacitor 64 by the switch element 63 when the switch element 63 goes on in response to the control signal CONT. Then, when the input circuit 60 is inactive, the switch element 63 goes off in response to the control signal CONT to hold the charge stored in the capacitor 64. The amplifier 65 generates the voltage V4, which is substantially equal to the voltage VZ, in accordance with the charge stored in the capacitor 64.

Accordingly, when the input circuit 60 is inactive, the node N1 is supplied with a voltage VB corresponding to the current I1 of the current source when the input circuit 60 is active (i.e., the DC bias current required for the operation of the MR element 11). Thus, even if the current of the current source 14 changes when the input circuit 60 is active, a voltage VB (voltage V4) that is in accordance with the change is supplied to the node N1 when the input circuit 60 is inactive.

Accordingly, the fluctuation of the potential difference between the two terminals of the capacitor 16 when the input circuit 60 shifts between an active state and an inactive state is small, which shortens the charge and discharge time of the capacitor 16. This shortens the transition period required for the input circuit 60 to shift from an inactive state to an active state. Although it is preferred that the voltage VB be equal to the voltage at the node N1 when the input circuit is active, the voltage VB may also be a value that is approximate to the active state voltage at the node N1. This would also shorten the charge and discharge time of the capacitor 16 and thus effectively reduce the transition period of the input circuit 60.

The input circuit 60 of the second embodiment has the advantage described below.

(1) The voltage supply circuit 61 of the input circuit 60 supplies the node N1 with a voltage VB corresponding to changes in the DC bias current of the current source 14. Accordingly, the transition period required for the input circuit 60 to shift from an inactive state to an active state is shortened even when the DC bias current I1 changes.

It should be apparent to those skilled in the art that the present invention may be embodied in many other specific forms without departing from the spirit or scope of the invention. Particularly, it should be understood that the present invention may be embodied in the following forms.

(a) The configuration of the voltage supply circuits 44, 61 and the current-voltage transform circuit 62 may be changed as required.

(b) Instead of connecting the transistor 43 between the first resistor 12a and the high potential power supply V1, the transistor 43 may be connected between the first resistor 12a and the MR element 11, between the MR element 11 and the second resistor 13, or between the second resistor 13 and the node N1.

(c) The second switch may be formed only by the NPN transistor 43, which is activated and deactivated in response to the control signal CONT.

The present examples and embodiments are to be considered as illustrative and not restrictive, and the invention is not to be limited to the details given herein, but may be modified within the scope and equivalence of the appended claims.

What is claimed is:

1. A magnetoresistive element input circuit having an active mode and an inactive mode, the input circuit comprising:

a first resistor connected between a magnetoresistive element and a first power source;

a first current source connected between the magnetoresistive element and a second power source for supplying a DC bias current to the magnetoresistive element in the active mode;

a second resistor connected between the magnetoresistive element and the first current source;

a capacitor connected to a node between the second resistor and the first current source and to the first power supply;

a differential amplifier connected to the magnetoresistive element; and a voltage supply circuit connected to the node for supplying the node, when the input circuit is in the inactive mode, with a voltage substantially equal to that supplied to the node when the input circuit is in the active mode.

2. The input circuit according to claim 1, wherein the voltage supply circuit includes:

a first transistor having an emitter connected to the node, a collector connected to the first power source, and a base;

a first switch connected between the base of the first transistor and the second power source;

a second transistor having an emitter connected to the base of the first transistor, a collector connected to the second power source, and a base connected to a predetermined voltage;

a second current source connected between the emitter of the first transistor and the second power supply; and a third current source connected between the emitter of the second transistor and the first power source.

3. The input circuit according to claim 2, wherein the second and third current sources supply the first and second transistors with first and second bias currents, respectively, the sum of the first and second bias currents being smaller than the DC bias current supplied to the magnetoresistive element by the first current source.

4. The input circuit according to claim 2, further comprising a second switch for selectively connecting and disconnecting the first power source and the node.

5. The input circuit according to claim 4, wherein the second switch is connected between the first power source and the first resistor.

6. The input circuit according to claim 1, further comprising a current-voltage transform circuit connected to the first current source for transforming the DC bias current from the first current source to a transform voltage, wherein the voltage supply circuit supplies the node with the transform voltage during the inactive mode.

7. The input circuit according to claim 6, wherein the current-voltage transform circuit includes a third switch connected to the first current source, a current-voltage transform amplifier connected between the third switch and the voltage supply circuit, and a second capacitor connected to a second node between the third switch and the current-voltage transform amplifier and to the second power source.

8. The input circuit according to claim 7, wherein the voltage supply circuit includes:

a first transistor having an emitter connected to the node, a collector connected to the first power source, and a base;

a first switch connected between the base of the first transistor and the second power source;

a second transistor having an emitter connected to the base of the first transistor, a collector connected to the second power source, and a base connected to the current-voltage transform amplifier;

a second current source connected between the emitter of the first transistor and the second power supply; and a third current source connected between the emitter of the second transistor and the first power source.

9. The input circuit according to claim 8, wherein the second and third current sources supply the first and second transistors with first and second bias currents, respectively, the sum of the first and second bias currents being smaller than the DC bias current supplied to the magnetoresistive element by the first current source.

10. The input circuit according to claim 9, further comprising a second switch for selectively connecting and disconnecting the first power source and the node.

11. The input circuit according to claim 10, wherein the second switch is connected between the first power source and the first resistor.

12. A magnetoresistive element input circuit having an active mode and an inactive mode, the input circuit comprising:

a first resistor connected between a magnetoresistive element and a first power source;

a first current source connected between the magnetoresistive element and a second power source for supplying a DC bias current to the magnetoresistive element in the active mode;

a second resistor connected between the magnetoresistive element and the first current source;

a capacitor connected to a node between the second resistor and the first current source and to the first power supply;

a differential amplifier connected to the magnetoresistive element; and a voltage supply circuit connected to the node for supplying the node, when the input circuit is in the inactive mode, with a voltage substantially equal to that supplied to the node when the input circuit is in the active mode, wherein the voltage supply circuit includes, a first transistor having an emitter connected to the node, a collector connected to the first power source, and a base, a first switch connected between the base of the first transistor and the second power source, a second transistor having an emitter connected to the base of the first transistor, a collector connected to the second power source, and a base connected to a predetermined voltage, a second current source connected between the emitter of the first transistor and the second power supply, and a third current source connected between the emitter of the second transistor and the first power source.

13. A magnetoresistive element input circuit having an active mode and an inactive mode, the input circuit comprising:

a first resistor connected between a magnetoresistive element and a first power source;

a first current source connected between the magnetoresistive element and a second power source for supplying a DC bias current to the magnetoresistive element in the active mode;

a second resistor connected between the magnetoresistive element and the first current source;

a capacitor connected to a node between the second resistor and the first current source and to the first power supply;

a differential amplifier connected to the magnetoresistive element;

a voltage supply circuit connected to the node for supplying the node, when the input circuit is in the inactive mode, with a voltage substantially equal to that supplied to the node when the input circuit is in the active mode; and a current-voltage transform circuit connected to the first current source for transforming the DC bias current from the first current source to a transform voltage, wherein the voltage supply circuit supplies the node with the transform voltage during the inactive mode.

* * * * *

UNITED STATES PATENT AND TRADEMARK OFFICE
CERTIFICATE OF CORRECTION

PATENT NO.   : 6,522,491 B1
DATED        : February 18, 2003
INVENTOR(S)  : Kawai It is certified that error appears in the above-identified patent and that said Letters Patent is hereby corrected as shown below:

<u>Title page,</u>
Item [30], Foreign Application Priority Data, change
"Jan. 30, 2000    (JP) ……………………………….. 2000-004772" to
-- Jan. 13, 2000    (JP) ……………...………………….. 2000-004772 --

Signed and Sealed this

Fifteenth Day of July, 2003

JAMES E. ROGAN
*Director of the United States Patent and Trademark Office*